(12) United States Patent
Shirahama

(10) Patent No.: US 12,051,771 B2
(45) Date of Patent: Jul. 30, 2024

(54) LIGHT EMITTING DEVICE AND METHOD OF MANUFACTURING LIGHT EMITTING DEVICE

(71) Applicant: NICHIA CORPORATION, Anan (JP)

(72) Inventor: Satoshi Shirahama, Anan (JP)

(73) Assignee: NICHIA CORPORATION, Anan (JP)

( * ) Notice: Subject to any disclaimer, the term of this patent is extended or adjusted under 35 U.S.C. 154(b) by 415 days.

(21) Appl. No.: 17/512,328

(22) Filed: Oct. 27, 2021

(65) Prior Publication Data

US 2022/0140211 A1 May 5, 2022

(30) Foreign Application Priority Data

Oct. 30, 2020 (JP) ................................. 2020-182755
Dec. 22, 2020 (JP) ................................. 2020-212573

(51) Int. Cl.
*H01L 33/60* (2010.01)
*H01L 27/15* (2006.01)

(52) U.S. Cl.
CPC ............ *H01L 33/60* (2013.01); *H01L 27/156* (2013.01); *H01L 2933/0058* (2013.01)

(58) Field of Classification Search
CPC .................. H01L 33/60; H01L 27/156; H01L 2933/0058; H01L 25/0753
See application file for complete search history.

(56) References Cited

U.S. PATENT DOCUMENTS

| | | | |
|---|---|---|---|
| 2013/0087825 A1* | 4/2013 | Umakoshi | H01L 33/62 252/514 |
| 2013/0181251 A1* | 7/2013 | Higuchi | H01L 33/642 257/99 |
| 2013/0193466 A1* | 8/2013 | Sudhiranjan | H01L 33/405 438/46 |
| 2014/0220714 A1* | 8/2014 | Sorimachi | H01L 24/97 438/15 |
| 2020/0312822 A1* | 10/2020 | Kim | H01L 25/0753 |
| 2021/0358896 A1* | 11/2021 | Lee | H01L 25/167 |

FOREIGN PATENT DOCUMENTS

| | | |
|---|---|---|
| JP | 2007-234779 A | 9/2007 |
| JP | 2007-324205 A | 12/2007 |
| JP | 2013-171924 A | 9/2013 |
| JP | 2017-168714 A | 9/2017 |
| JP | 2019-125683 A | 7/2019 |

* cited by examiner

*Primary Examiner* — Sitaramarao S Yechuri
(74) *Attorney, Agent, or Firm* — Global IP Counselors, LLP

(57) ABSTRACT

A light emitting device includes a substrate, a reflective resin layer, and a light emitting element. The reflective resin layer is disposed on the substrate and contains a first reflective material and a first resin. The reflective resin layer including first flat part having a first thickness, a second flat part having a second thickness smaller than the first thickness, and a protruded part having a third thickness larger than the first thickness. The light emitting element is disposed on the second flat part of the reflective resin layer, with a portion of a lateral face of the protruded part of the reflective resin layer being in contact with a portion of a lateral face of the light emitting element.

21 Claims, 14 Drawing Sheets

LIGHT EMITTING DEVICE AND METHOD OF MANUFACTURING LIGHT EMITTING DEVICE

CROSS-REFERENCE TO RELATED APPLICATION

This application claims priority to Japanese Patent Application No. 2020-182755 filed on Oct. 30, 2020, and Japanese Patent Application No. 2020-212573 filed on Dec. 22, 2020, the disclosures of which are hereby incorporated herein by reference in their entireties.

BACKGROUND

The present disclosure relates to a light emitting device and a method of manufacturing the light emitting device.

In recent years, LED modules using light emitting diodes (LEDs) have been utilized in various applications, and LED modules having enhanced emission characteristics have been proposed for specific applications. For example, in the light emitting device disclosed in Japanese Patent Publication 2019-125683, a high reflectance material is used as the substrate on which the light emitting elements are disposed to increase the light extraction efficiency of the light emitting device. There is a need to further improve the light extraction efficiency of such a light emitting device.

SUMMARY

One of the objects of the present disclosure is to provide a light emitting device with higher light extraction efficiency and a method of manufacturing such a light emitting device.

A light emitting device as a first embodiment is described below.

A light emitting device includes a substrate, a reflective resin layer, and a light emitting element. The reflective resin layer is disposed on the substrate and contains a first reflective material and a first resin. The reflective resin layer including a first flat part having a first thickness, a second flat part having a second thickness smaller than the first thickness, and a protruded part having a third thickness larger than the first thickness. The light emitting clement is disposed on the second flat part of the reflective resin layer, with a portion of a lateral face of the protruded part of the reflective resin layer being in contact with a portion of a lateral face of the light emitting element.

A method of manufacturing a light emitting device as a second embodiment is described below.

A method of manufacturing a light emitting device includes: applying a reflective resin containing a first reflective material and a first resin on a substrate; disposing a light emitting element on the reflective resin applied on the substrate by pressing a portion of the light emitting element into the reflective resin, thereby forming with the reflective resin, a first flat part where the light emitting element is not disposed, the first flat part having a first thickness, a second flat part where the light emitting element is disposed, the second flat part having a second thickness smaller than the first thickness, and a protruded part partially in contact with a portion of a lateral face of the light emitting element, the protruded part having a third thickness larger than the first thickness; and hardening the reflective resin.

According to certain embodiment of the present disclosure, a light emitting device with higher light extraction efficiency and a method of manufacturing such a light emitting device can be provided.

DETAILED DESCRIPTION

Figure 1A:
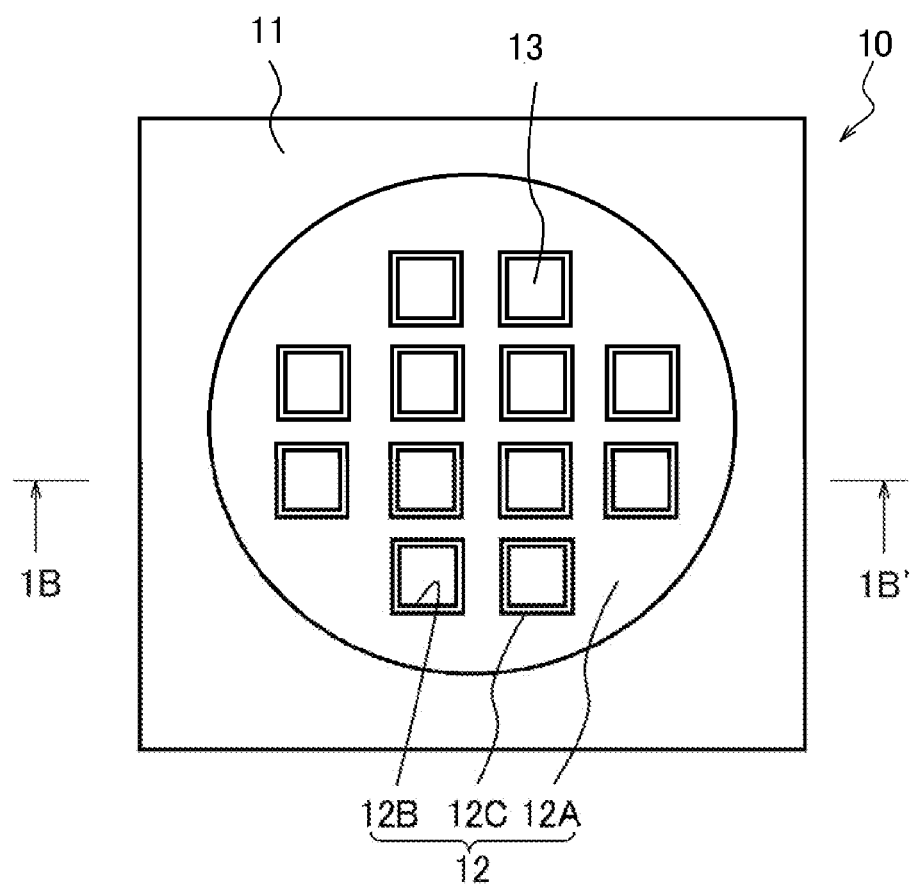
FIG. 1A is a schematic top view of a light emitting device according to an embodiment of the present disclosure.

Certain embodiments of the present invention will be explained below with reference to the accompanying drawings. The embodiments described below, however, are examples for giving shape to the technical ideas of the present invention, and are not intended to limit the present invention to those described below. The sizes and the relative positions of the members shown in each drawing might be exaggerated for clarity of explanation. The same designations and reference numerals basically denote the same or equivalent members for which redundant explanations will be omitted as appropriate. In the description, the term, "process," refers to not only an independent process, but also one that achieves the expected objectives of a process even if it cannot be clearly distinguished from other processes.

Light Emitting Device

Figure 1B:
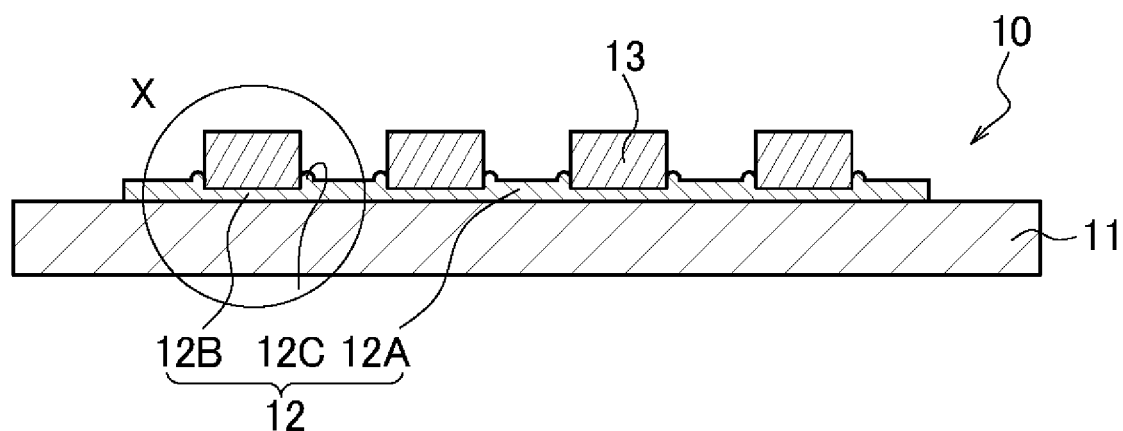
FIG. 1B is a cross-sectional view taken along line 1B-1IB' in FIG. 1A.

A light emitting device 10 according to an embodiment of the present disclosure, as shown in FIGS. 1A and 1B, includes a substrate 11, a reflective resin layer 12 disposed on the base 11, and light emitting elements 13 disposed on the reflective resin layer 12.

Figure 1C:
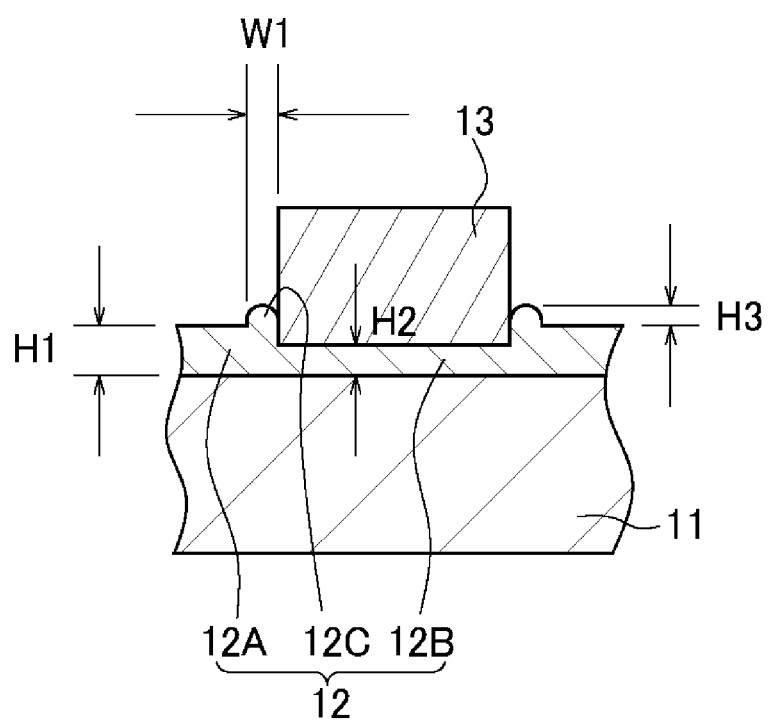
FIG. 1C is a schematic enlarged view of the portion X in FIG. 1B.

The reflective resin layer 12 includes a first reflective material and a first resin. The reflective resin layer 12 has a first flat part 12A, second flat parts 12B, and first protruded parts 12C (protruded parts). The first flat part 12A, the second flat parts 12B, and the first protruded parts 12C are located on the substrate 11. The first flat part 12A has a first thickness (denoted as "H1" in FIG. 1C), the second flat parts 12B each have a second thickness (denoted as "H2" in FIG. 1C), and the first protruded parts 12C each have a third thickness (denoted as "H1+H3" in FIG. 1C). The second thickness H2 of the second flat parts 12B is smaller than the first thickness H1 of the first flat part 12A. The first protruded parts 12C protrude from the upper end of the first flat part 12A. Each first protruded part 12C is formed such that its lateral faces on the second flat part 12B side opposite the first flat part 12A side are partly in contact with the lateral faces of the light emitting element 13. The portions of the reflective resin layer 12 located directly under the light emitting elements 13 are the second flat parts 12B. The portions connected to the second flat parts 12B where the lateral faces of the reflective resin layer 12 are partly in contact with the lateral faces of the light emitting elements 13 are the first protruded parts 12C. The portion spreading around the first protruded parts 12C (i.e., on the periphery of the first protruded parts 12C away from the light emitting elements 13) is the first flat part 12A. The "thickness" in this description refers to the average value of the distances between the upper end and the lower end of a member measured in the direction perpendicular to the substrate.

The light emitting elements 13 are disposed on the second flat parts 12B of the reflective resin layer 12.

Such a structure allows the first protruded parts to be utilized to readily reflect the light exiting the lateral faces of the light emitting elements upwards, thereby further increasing the light extraction efficiency of the light emitting device.

Figure 2A:
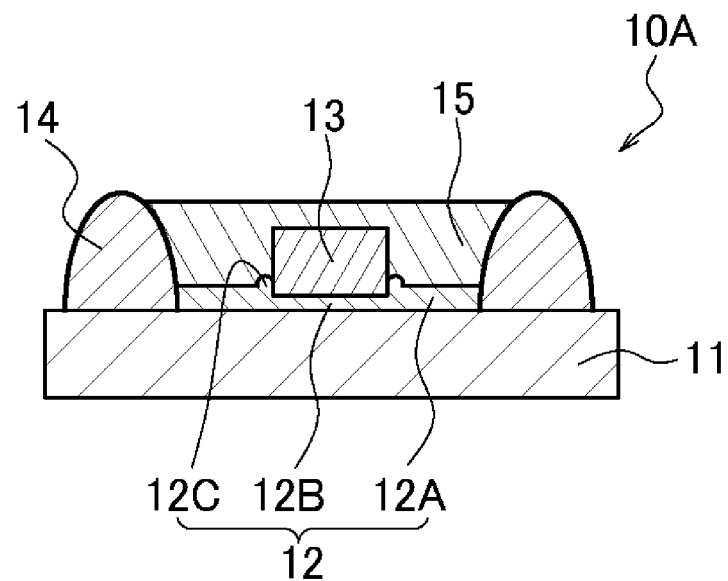
FIG. 2A is a schematic cross-sectional view of a light emitting device according to another embodiment of the present disclosure.
Figure 2B:
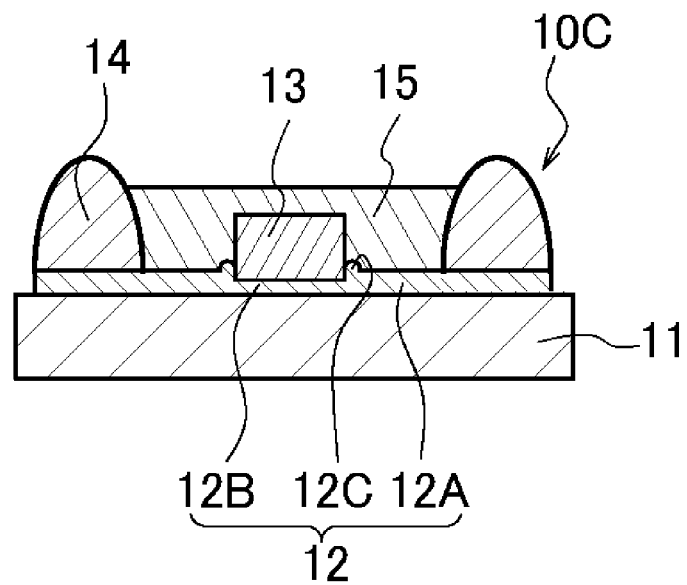
FIG. 2B is a schematic cross-sectional view of a light emitting device according to yet another embodiment of the present disclosure.
Figure 4A:
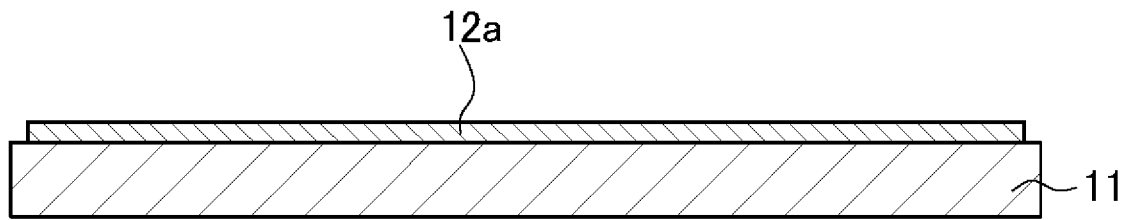
FIG. 4A is a schematic cross-sectional view explaining a method of manufacturing a light emitting device according to an embodiment of the present disclosure.
Figure 4B:
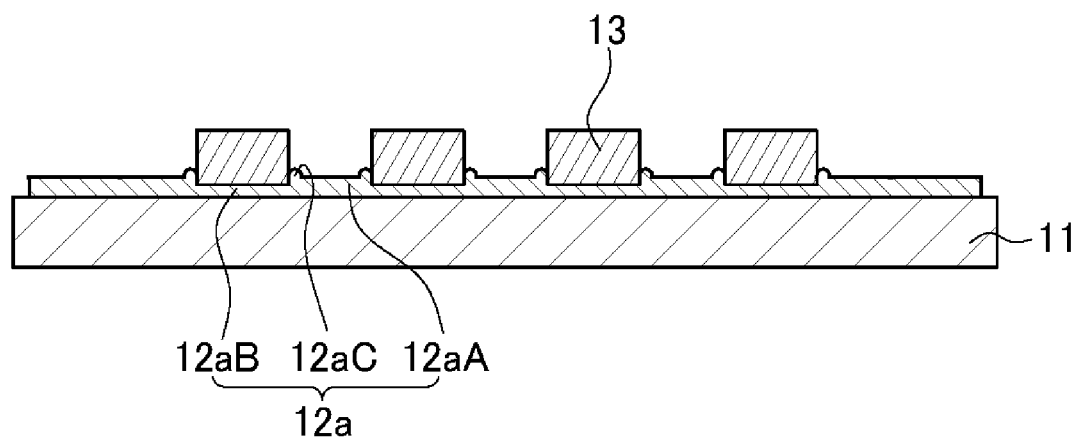
FIG. 4B is a schematic cross-sectional view explaining the method of manufacturing a light emitting device according to the embodiment of the present disclosure.
Figure 4C:
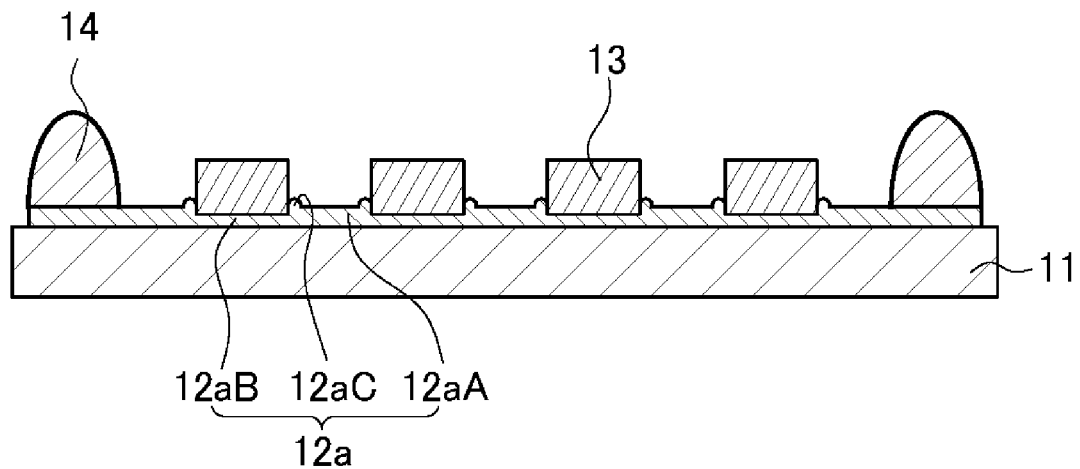
FIG. 4C is a schematic cross-sectional view explaining the method of manufacturing a light emitting device according to the embodiment of the present disclosure.
Figure 4D:
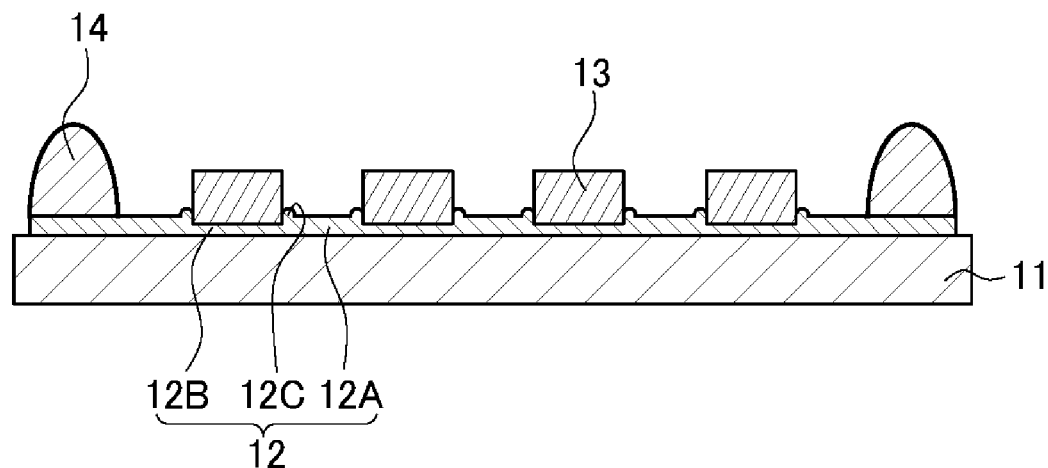
FIG. 4D is a schematic cross-sectional view explaining the method of manufacturing a light emitting device according to the embodiment of the present disclosure.
Figure 4E:
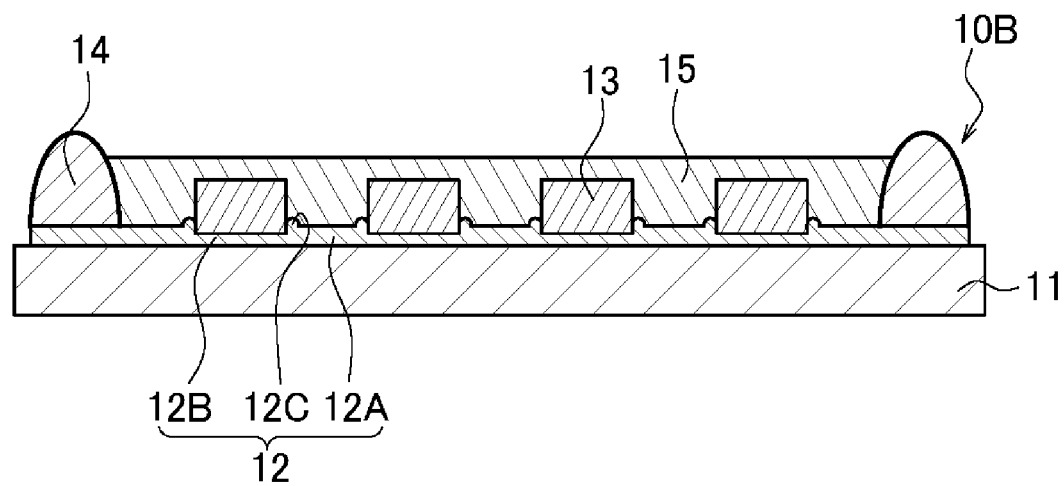
FIG. 4E is a schematic cross-sectional view explaining the method of manufacturing a light emitting device according to the embodiment of the present disclosure.

The light emitting device may further include a frame 14 as shown in the light emitting device 10A/10C of FIG. 2A/2B or the light emitting device 10B/10D of FIG. 4E/5E. In such a case, the frame 14 may be disposed outside of the reflective resin layer 12, i.e., on the substrate 11 as shown in FIG. 2A/5E, disposed on the reflective resin layer 12 as shown in FIG. 2B/4E, or disposed to straddle the substrate 11 and the reflective resin layer 12. Furthermore, the light emitting element(s) 13 may be covered by an encapsulant 15 disposed inward of the frame 14.

Substrate 11

A substrate 11 is a member on which a reflective resin layer 12 is disposed, and includes a wiring layer.

For the substrate 11, for example, an insulation material such as a resin or ceramic, or a metal substrate on which an insulation member is formed on the surface can be used. Among these, a metal substrate including at least one selected from the group consisting of aluminum and copper is preferable from the standpoint of machinability and heat dissipation properties. The surface of such a metal substrate may be covered with a high reflectance layer of a material such as silver, gold, or an alloy of the two.

The wiring layer can be formed of a material capable of supplying electric current to the light emitting elements, including metals, such as copper, aluminum, gold, silver, platinum, titanium, tungsten, palladium, iron, nickel, or alloys of these. The outermost surface of the wiring layer formed on the upper face of the substrate 11 may be covered with a high reflectance material such as silver, gold, or an alloy of the two. In the case of using silver or an alloy thereof as the outermost surface of the wiring layer, the initial brightness might decline as the silver turns into silver sulfide and tarnishes with the passage of time. However, disposing a reflective resin layer 12 on the substrate 11, particularly on the wiring layer as described above can protect the wiring layer from the outside environment, thereby effectively suppressing the wiring layer from tarnishing over time. The quality of a high light extraction efficiency light emitting device can be ensured over a long period of time by allowing the reflective resin layer 12 to not only reflect the light from the light emitting elements, but also suppress the wiring layer from changing with the passage of time. The wiring layer can be formed by electroplating, electroless plating, vapor deposition, sputtering, or the like. For example, in the case of employing Au bumps in mounting light emitting elements on a substrate, the bondability between the light emitting elements and the substrate can be improved by using Au as the outermost surface of the wiring layer.

The wiring layer is preferably formed as a positive and negative pair pattern of various shapes and thicknesses. The wiring layer may be provided at least at one of the locations: on the upper face, the inside, and the lower face of the substrate 11. The substrate 11 may include additional wiring for connecting a protective device in addition to the wiring layer disposed on the upper face.

Reflective Resin Layer 12

A reflective resin layer 12 is a member disposed on the upper face of the substrate 11, and when a metal substrate is used as the substrate 11, in particular, can provide insulation, while suppressing the substrate from absorbing the light emitted from a light emitting element and efficiently reflecting the light, thereby increasing the light extraction efficiency of the light emitting de cc, The reflective resin layer 12 has a first plat part 12A, a second flat part 12B, and a first protruded part 12C. The second flat part 12B is the part on which a light emitting element will be disposed, and the area of the second flat part is preferably the same as the area of the light emitting element in a plan view. The thickness of the second flat part 12B is smaller than the first thickness of the first flat part 12A. This is attributable to pressing a light emitting element 13 into the material for the reflective resin layer 12 after disposing the material for the reflective resin layer 12 on the substrate 11, which creates a recess along the outer shape of the light emitting element 13 configured of the, bottom face and portions of the lateral faces, followed by hardening the material for the reflective resin layer 12 while retaining the recess. For example, the difference between the first thickness Hi of the first flat part 12A and the second thickness H2 of the second flat part 12B can be 1 µm to 80 µm. The first thickness H1 of the first plat part 12A can be 10 µm to 100 µm, preferably 10 µm to 50 µm, more preferably 10 µm to 30 µm. The second thickness H2 of the second flat part 12B can be 1 µm to 20 µm, preferably 1 µm to 15 µm, more preferably 1 µm to 10 µm.

Figure 1D:
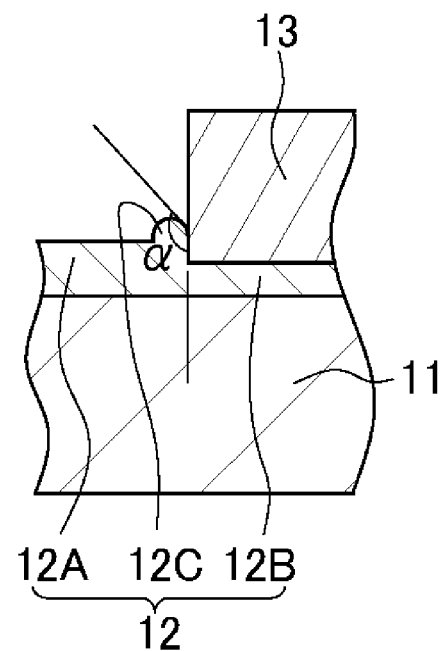
FIG. 1D is a schematic enlarged view of a pertinent part in FIG. 1C.
Figure 1E:
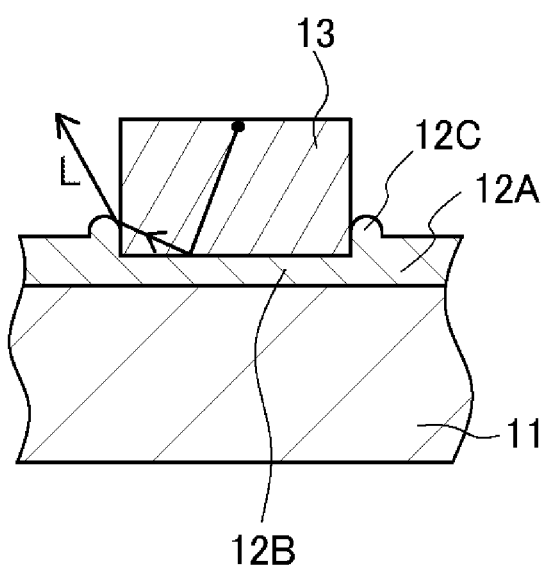
FIG. 1E is a schematic cross-sectional view of a pertinent part explaining a path of the light in the light emitting device shown in FIG. 1A.

The first protruded part 12C protrudes from the upper end of the first flat part 12A. Some portions of the lateral faces of the first protruded part 12C are in contact with the lateral faces of the light emitting elements 13. The contact here means that the reflective resin layer 12 configured of the first protruded part 12C is directly in contact with the lateral faces of the light emitting element 13 without interposing airy other material. The thickness of the first protruded part 12C from the upper end of the first flat part 12A (denoted as "H3" in FIG. 1C) can be, for example, no more than 0.3 times, preferably no more than 0.2 times, more preferably no more than 0.1 times the thickness of the light emitting element. In other words, the difference between the third thickness of the first protruded part 12C and the first thickness can be set as no more than 0.3 times, preferably no more than 0.2 times, more preferably no more than 0.1 times the thickness of the light emitting element. With such a thickness, the light exiting the lateral faces of the light emitting elements is not obstructed, and the degradation of the emission efficiency can be suppressed. Specifically, the third thickness of the first protruded part 12C (H1+H3) is preferably no more than 30 µm, more preferably no more than 20 µm, even more preferably no more than 15 µm. The maximum width (denoted as "W1" in FIG. 1C) of the first protruded part 12C from a lateral face of the light emitting element in a plan view, i.e., the distance to the first flat part 12A on the substrate 11, is preferably no more than 25 µm, more preferably no more than 20 µm, even more preferably no more than 15 µm. The first protruded part 12C preferably surrounds the light emitting element. In this case, it can surround the entire or part of the perimeter of the light emitting element. In this manner, as shown in FIG. 1E, the light emitted by the light emitting element that traveled towards the substrate 11 and exited a lower lateral face of the light emitting element can be effectively reflected upwards, to thereby increase the light extraction efficiency of the light emitting device.

The first protruded part 12C is preferably arc shaped bulging outwardly on the side opposite to and not in contact with the light emitting element in a cross section taken perpendicularly to a main face of the substrate. In the case in which multiple light emitting elements are disposed on a substrate, the first protruded parts 12C haying this shape can more efficiently reflect the light from adjacent light emitting elements to exit the light emitting device than the inwardly concave arc shape formed by allowing a resin with high fluidity to creep up the lateral faces of the light emitting elements.

The upper lateral faces of the first protruded part 12C are positioned apart from the lateral faces of the light emitting element 13. The contact angle between an upper lateral face of the first protruded part 12C and the lateral face of the light emitting element (the angle α in FIG. ID) is, for example, at least 90 degrees, preferably at least 105 degrees, more preferably at least 110 degrees, even more preferably at least 120 degrees. In other words, even though the reflective resin layer 12 is in contact with the lateral faces of a light emitting element 13, the reflective resin layer 12 is preferably a material having low wettability with respect to the light emitting element.

Regardless of the number of light emitting elements disposed on a substrate, particularly in the case of disposing multiple light emitting elements on a large-area upper face of a substrate 11 as in the case of a light emitting device 10 in FIGS. 1A and 1B, the first flat part 12A may be integrally provided around the first protruded parts 12C being in contact with the lateral faces of the light emitting elements 13. When the first flat part 12A is integrally provided over large area, i.e., the light reflective resin layer 12 covers a large area of the upper face of the substrate 11, the light emitted from the light emitting elements can be efficiently reflected towards the light extraction face. This can also effectively suppress the sulfurization of silver or the like in the case in which a silver or silver alloy film is formed on the surface of the substrate, for example.

Figure 7:
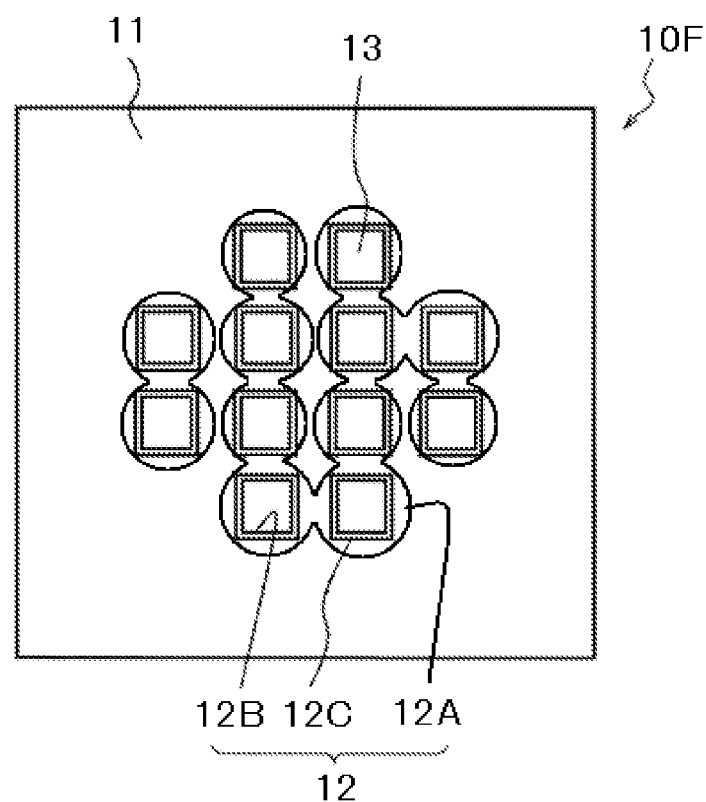
FIG. 7 is a schematic top view of a light emitting device according to vet another embodiment of the present disclosure.

For example, as in the case of the light emitting device 10E or 10G shown in FIG. 6A, 6B, 8A, or 8B, the first flat parts 12A of the light reflective resin layer 12 may be provided per light emitting element 13 in the periphery of the first protruded parts 12C that are in contact with the light emitting elements so as to be spaced apart from one another (i.e., a gap is formed in the first flat part 12A so as to expose a part of the substrate 11 between the adjacent first protruded parts 12C), or as in the case of the light emitting device 10F shown in FIG. 7, provided such that only some are spaced apart from one another with respect to the first protruded parts 12C in contact with the lateral faces of adjacent light emitting elements 13. Disposing the first flat parts 12A such that some or all are spaced apart from one another can effectively suppress the disadvantages such as allowing the light emitting elements 13 disposed on the reflective resin to move along with the reflective resin and come into contact with one another before the reflective resin hardens.

Examples of materials for the first reflective material include titanium oxide, silicon oxide, zirconium oxide, potassium titanate, aluminum oxide, aluminum nitride, boron nitride, mullite, niobium oxide, barium sulfate, various rare earth oxides (e.g., yttrium oxide and gadolinium oxide), and the like. Among these, titanium oxide is preferable from the standpoint of increasing reflectivity, and boron nitride is preferable from the standpoint of thermal conductivity.

The first reflective material preferably has a uniform particle size. In this manner, when multiple light emitting elements are disposed, the heights of the individual light emitting elements on the substrate can be close to being uniform without tilting. For the first reflective material, one having a median diameter of no more than 1 μm, for example, can be used, and the median diameter is preferably no more than 0.5 μm, more preferably no more than 0.3 μm. Particularly, it is preferable for the first reflective material to substantially not contain particles having a median diameter larger than 2 μm. "Substantially not containing" here means 5 mass percent at most, 3 mass percent at most, 1 mass percent at most, or 0.5 mass percent at most of the first reflective material. When the reflective resin layer does not contain large particles, the light emitting elements disposed thereon tend not to tilt, and protrusions or indentations tend not to be created on the surface of the first flat part, as a result, the smooth surface can increase the reflection efficiency.

Examples of the first resin include thermosetting resins and thermoplastic resins. Specific examples include an epoxy resin composition; silicone resin composition; modified epoxy resin compositions, such as silicone modified epoxy resin; modified silicone resin compositions such as an epoxy modified silicone resin; hybrid silicone resins; polyimide resin compositions and modified polyimide resin compositions; polyphthalamide (PPA); polycarbonate resins; polyphenylenesulfide (PPS); liquid crystal polymers (LCP); ABS resins; phenolic resins; acrylic resins; PBT resins, and the like. Among these, a resin containing at least one among silicone, modified silicone, epoxy, modified epoxy, and acrylic resins, or a hybrid resin is preferable. Particularly, a resin containing one or more selected among thermosetting resins, i.e., silicone and epoxy resins, is more preferable.

The reflective resin layer 12, particularly the first flat part 12A or the second flat part 12B is preferably adjusted to have a reflectance of at least 90% with respect to light having a wavelength of 450 nm. For example, the content of the first reflective material can be adjusted to 5 mass percent to 80 mass percent, preferably 5 mass percent to 50 mass percent, more preferably 7 mass percent to 30 mass percent relative to the mass of the first resin.

Light Emitting Element 13

A light emitting element 13 is disposed on a substrate 11. Two or more light emitting elements 13 may be disposed on the substrate 11 as shown in FIGS. 1A and 1B, or a single light emitting element 13 may be disposed as in the case of the light emitting devices 10A and 10C shown in FIGS. 2A and 2B. The light emitting element is preferably directly adhered to the reflective resin layer without interposing another adhesive.

The light emitting element 13 is disposed in a region surrounded by a first protruded part 12C in a plan view. A light emitting diode is preferably used for the light emitting element 13. A light emitting element emitting light having an appropriately selected wavelength can be used. Examples of a blue or green light emitting element includes one using a nitride semiconductor, ZnSe, or GaP. Such a light emitting element has a peak emission wavelength in the range of 350 nm to 500 mm, for example. For a red light emitting element, GaAlAs, AlInGsP, or the like can be used. Alternatively, a semiconductor light emitting element formed of materials other than these can be used.

A light emitting element 13 is formed, for example, by stacking nitride semiconductor layers on a light transmissive support substrate, and the support substrate side becomes a main light extraction face of the light emitting element 13. The support substrate may be removed, for example, by polishing, laser liftoff, or the like. For the light emitting element 13, one having a pair of electrodes on the same face, for example, is preferable.

The light emitting element 13 is preferably disposed on the substrate 11 by using the face provided with the electrodes as the upper face while allowing the face without the electrodes to face the substrate 11. In this case, the electrodes are electrically connected to the wiring layer on the substrate using wires.

Frame 14

When only one light emitting element is disposed on the substrate 11, the frame 14 is disposed to surround the light emitting element 13 outward from the first protruded part 12C as shown in FIG. 2A or 2B. In this case, the frame 14 may be disposed outward of the first flat part 12A, i.e., directly on the substrate 11, or on the first flat part 12A. Alternatively, the frame 14 may be disposed to straddle the substrate 11 and the first flat part 12A. When two or more light emitting elements are disposed on the substrate 11, the frame 14 is preferably disposed in the vicinity of the peripheral portion of the substrate 11 outward from the first protruded parts 12C so as to surround all of the light emitting elements 13 as shown in FIG. 4D, 5D, 8A, or 8E.

The frame 14 is used to direct the light emitted from a light emitting element upwards. Accordingly, the frame 14 is preferably formed, for example, of a material which includes a second resin, particularly, a second resin containing a second reflective material. Examples of materials for the second resin include those for use as or similar to the first resin described above. Examples of the second reflective materials include those for use as or similar to the first reflective material described above. For the first resin and the second resin, the same material or different materials can be used. For the first reflective material and the second reflective material, the same material or different materials can be used.

The height, the width, the position, and the like of the frame 14 can be suitably set. For example, the frame 14 is preferably disposed such that its upper face is positioned higher than the upper face(s) of the light emitting element(s). Specifically, the height of the frame 14 can be 10 μm to 500 μm, preferably 50 μm to 300 μm. By setting the height of the frame to fall within these ranges, even in the case of a face-up mounted light emitting device uses wires for electrical connection, the encapsulant 15 described later can cover the wire loop tops when applied to cover the light emitting element 13. The lateral faces of the frame 14, particularly the lateral face facing the light emitting element(s), may be perpendicular to the substrate in a cross section taken perpendicularly to a main face of the substrate, or be straight or curved faces such that the upper portion has a smaller width.

Encapsulant 15

The encapsulant 15 which is a member that covers the light emitting element(s) 13 on the substrate 11 preferably covers the reflective resin layer 12, and the light emitting element(s) 13 partly or entirely, more preferably entirely as shown in FIG. 2A, 2B, or 4E. The thickness of the encapsulant 15 is not particularly limited so long as the encapsulant 15 covers the light emitting element(s) 13 entirely in the thickness direction and the upper face(s). For example, the encapsulant is preferably disposed such that its upper face is positioned at the substantially same height of the frame 14 or lower.

The encapsulant 15 is preferably formed with a material which includes a third resin, for example. Examples of materials for the third resin include those for use as or similar to the first resin described above. Among these, a light transmissive resin which transmits at least 60%, at least 70%, at least 75%, or at least 80% of the light emitted by the light emitting element(s) 13 is preferable. The material including a third resin may contain at least either a light diffusing agent or a phosphor which can convert the wavelength of at least a portion of the incident light.

The encapsulant 15 can contain a phosphor. For the phosphor, one that can be excited by the light emitted from the light emitting element(s) is used. For example, phosphors excitable by a blue or ultraviolet light emitting element include cerium activated yttrium aluminum garnet based phosphors (YAG:Ce), cerium activated lutetium aluminum garnet based phosphors (LAG:Ce), europium activated silicate based phosphors (($Sr,Ba)_2SiO_4$:Eu), β-SiAlON phosphors, nitride based phosphors represented by the compositional formulas such as $CaAlSiN_3$:Eu and (Sr,Ca)$AlSiN_3$:Eu, Mn activated fluoride phosphors, sulfide based phosphors, and quantum dot phosphors. By combining these phosphors with a blue or ultraviolet light emitting element, a light emitting device of a desired emission color (e.g., a white light emitting device) can be manufactured.

Examples of light diffusing agents include fillers such as titanium oxide, barium titanate, aluminum oxide, silicon oxide, zirconium oxide, AEROS1L, glass, glass fiber and wollastonite, aluminum nitride, and the like.

For the material for the encapsulant 15, a high fluidity resin that hardens when heated or exposed to light is preferable from the standpoint of preventing void formation. Such materials include, for example, those that have fluidity at a 0.5 Pa·s to 30 Pa·s viscosity.

Method of Manufacturing Light Emitting Device

Figure 3A:
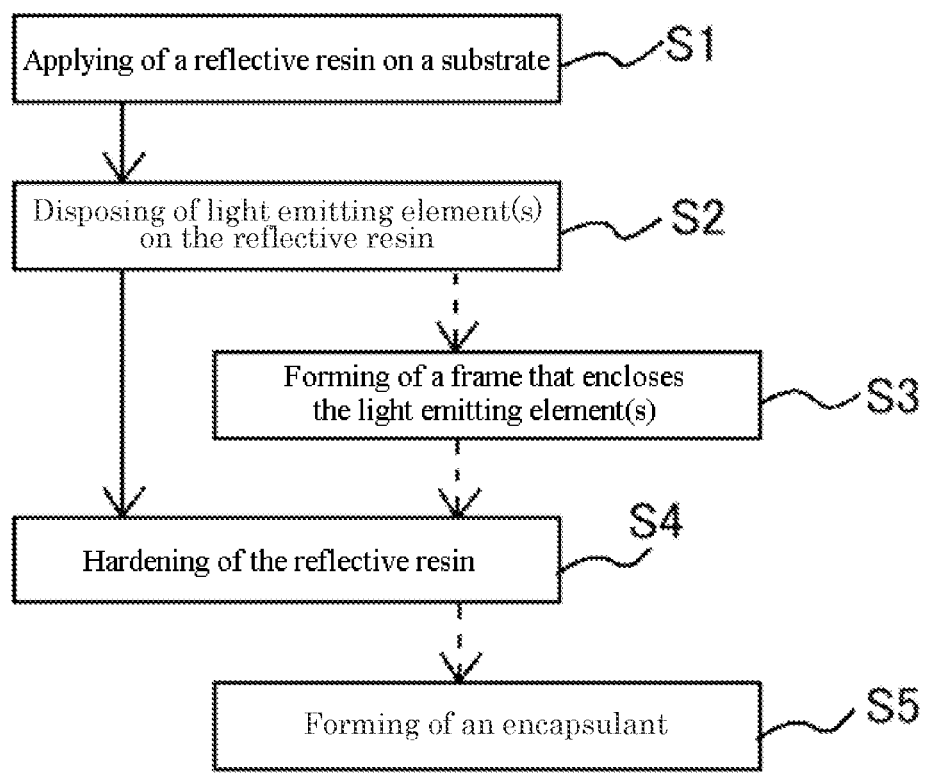
FIG. 3A is a flowchart of a method of manufacturing, a light emitting device according to an embodiment of the present disclosure.
Figure 3B:
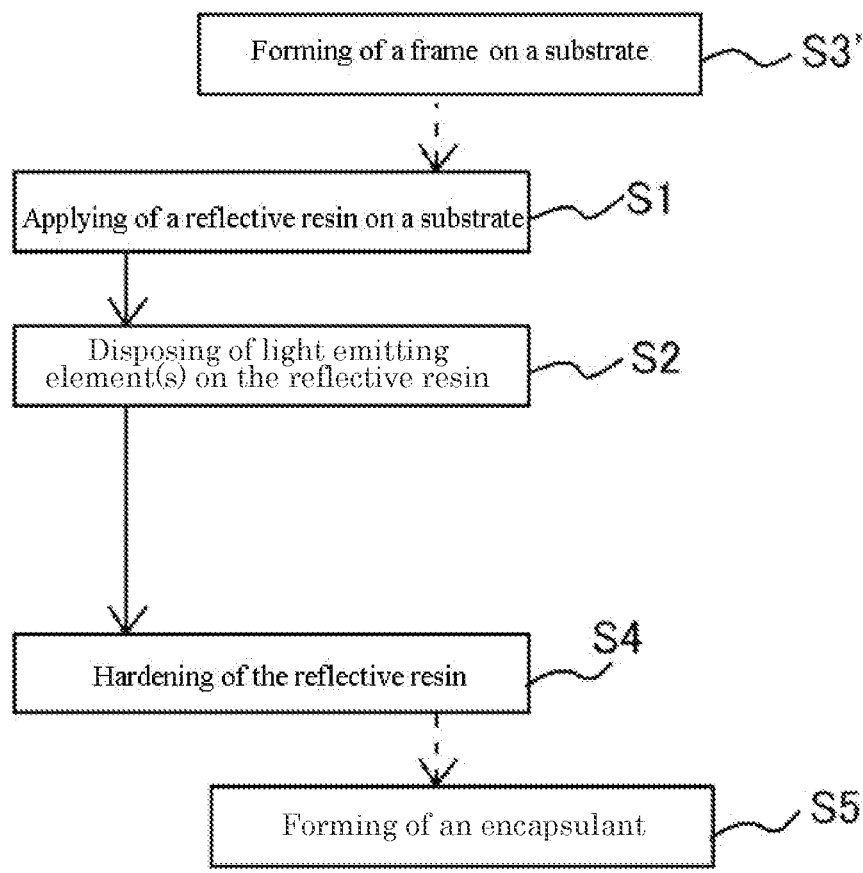
FIG. 3B is a flowchart of a method of manufacturing a light emitting device according to another embodiment of the present disclosure.

An example of a method of manufacturing a light emitting device according to the embodiment will be explained. The method of manufacturing a light emitting device according to the embodiment, as shown in FIGS. 3A and 3B, includes: a process for applying a reflective resin on a substrate (S1); a process for disposing light emitting element(s) on the reflective resin (S2); and a process for hardening the reflective resin (S4).

In this method, in the process for disposing light emitting element(s) (S2), a portion of a light emitting element is pressed into the reflective resin. Hardening the reflective resin will form, in the reflective resin layer, a first flat part where no light emitting element is disposed, a second flat part where the light emitting element is disposed and is thinner than the first flat part, and a first protruded part along the periphery of the light emitting element.

Such a manufacturing method can manufacture the light emitting device having high light extraction efficiency described above in a simplified manner.

The method of manufacturing a light emitting device may include a process for forming encapsulant (S5).

Moreover, the method of manufacturing a light emitting device may include a process for forming a frame that encloses the light emitting element(s) (S3) subsequent to the process S2 as shown in FIGS. 3A and 4A to 4E or FIGS. 8A to 8E, or a process for forming a frame on the substrate (S3') prior to the process S1 as shown in FIGS. 3B and 5A to 5E.

Process for Applying Reflective Resin on Substrate (S1)

As shown in FIG. 3A and FIG. 4A, a reflective resin 12a is applied on a substrate 11. The reflective resin 12a, as described above, includes a first reflective material and a first resin. The reflective resin 12a may be applied across the entire upper face of the substrate 11 or the upper face except for some areas. The reflective resin is preferably applied to the area where the light emitting elements will be disposed and the peripheral area thereof in an integrated manner.

The reflective resin 12a preferably contains an organic solvent together with a first reflective material and a first resin. Any organic solvent regularly used in the art can be used, for example, alcohols (isopropyl alcohol, 3-methoxy butanol, 3-methyl-3-methoxy butanol, or the like), ketones (cyclohexanone or the like), esters (γ-butyrolactone, propylene glycol monomethyl ether acetate, ethyl lactate, or the like), ethers (diethyl ether, THF, propylene glycol monomethyl ether, or the like), hydrocarbons (cyclohexane, n-hexane, heptane, isooctane, tridecane, or the like), aromatic hydrocarbons (xylene, toluene, or the like), or the like. These solvents may be used singly or in combination of two or more. Among these, one having a boiling point in the range of 150° C. to 300° C. is preferable, specifically, tridecane is preferable. The amount of the solvent contained can be, for example, 25 mass percent to 500 mass percent of the total mass of the reflective resin, and in the case of employing tridecane, in particular, the amount contained in the reflective resin is preferably 200 mass percent to 400 mass percent of the total mass of the reflective resin.

The thickness of the applied reflective resin 12a is preferably adjusted such that the maximum thickness of the hardened reflective resin is 10 μm to 100 μm. The reflective resin is preferably applied on the substrate 11 in uniform thickness. Examples of application methods include methods known in the art, such as potting, various types of printing, spin coating, or the like.

Figure 8A:
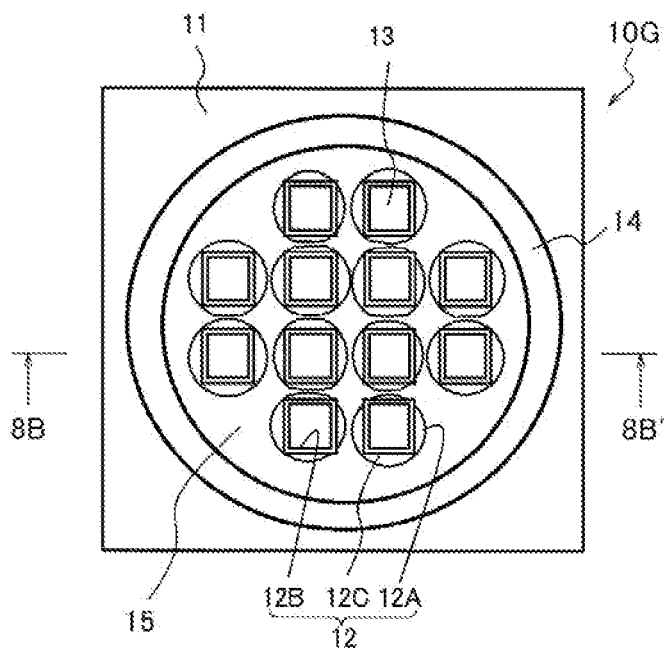
FIG. 8A is a schematic top view of a light emitting device according to another embodiment of the present disclosure.
Figure 8B:
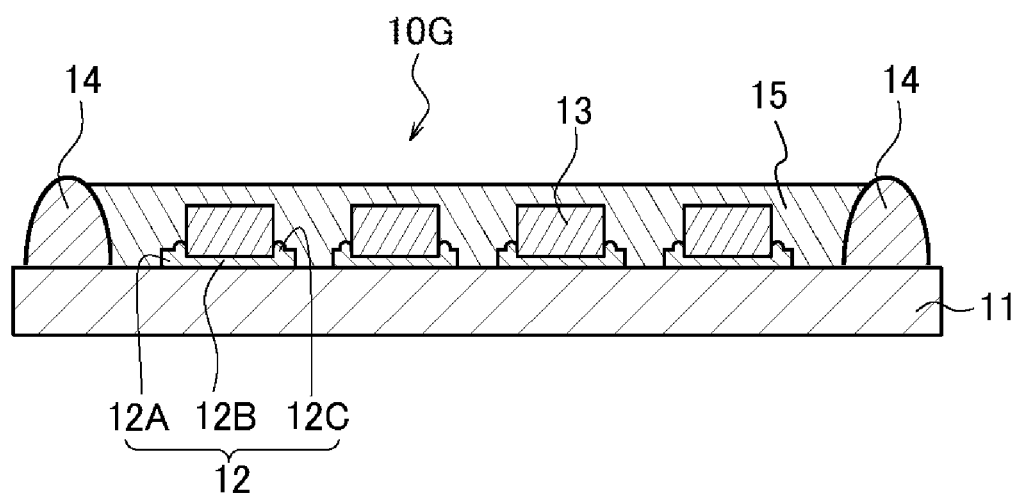
FIG. 8B is a cross-sectional view taken along 8B-8B' in FIG. 8A.
Figure 8C:
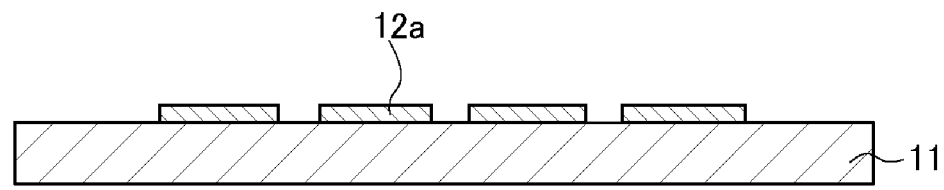
FIG. 8C is a schematic cross-sectional view explaining a method of manufacturing the light emitting device shown in FIG. 8A.

In this process, as shown in FIG. 8C, the reflective resin 12a may be applied in a plurality of areas spaced apart from one another and corresponding to the areas where the light emitting elements will be disposed. The size of the reflective resin 12a at each location here, for example, can be 100% to 200%, preferably 110% to 180%, of the planar area of a light emitting element.

Process for Disposing Light Emitting Element on Reflective Resin (S2)

As shown in FIG. 3A and FIG. 4B, one or more light emitting elements 13 are disposed on the reflective resin 12a applied on the substrate 11. Here, the light emitting elements 13 are disposed on the reflective resin 12a which has not hardened. In disposing a light emitting element 13 on the reflective resin 12a, a portion of the light emitting element 13 is pushed into the reflective resin. Because each area 12aB (which later becomes a second flat part) of the reflective resin 12a is formed as a light emitting element 13 is pressed in towards the substrate 11, the thickness of the reflective resin 12a at the area 12aB where a light emitting element 13 is disposed can be made smaller than the reflective resin 12a at an area 12aA (which later becomes a first flat part) where no light emitting element 13 is disposed. At this time, a portion of the reflective resin 12a pressed with a light emitting element 13 is displaced onto the lateral face side of the light emitting element 13. This can form a mound 12aC (which later becomes a first protruded part) of the reflective resin 12a along the perimeter of the light emitting element 13. Each mound 12aC of the reflective resin 12a has an outwardly bulging arc shape in a cross section taken perpendicularly to a main face of the substrate. For example, if a light emitting element were pressed into a low viscosity resin layer, the resin would creep up the lateral faces of the light emitting element to cover the lateral faces. In this case, in a cross section taken perpendicularly to a main face of the substrate, the resin that crept up a lateral face of a light emitting element forms an inwardly concave arc at the lateral face on the side that is located opposite to the lateral surface side of the light emitting element. In contrast, the reflective resin 12a described above forms an arc which bulges outwardly at the lateral faces that are located opposite to the lateral surface side of a light emitting element 13 in a cross section taken perpendicularly to a main face of the substrate. In order to achieve such an outwardly bulging arc shape, for example, the composition of the reflective resin 12a is preferably adjusted as described above. As a specific example, the composition can be adjusted by mixing a 5 mass percent to 200 mass percent light reflecting first reflective material with a 1 Pa·s to 5 Pa·s viscosity transparent silicone resin such that the viscosity of the material for the reflective resin 12a would be 1 Pa·s to 500 Pa·s, preferably 10 Pa·s to 250 Pa·s.

Figure 8D:
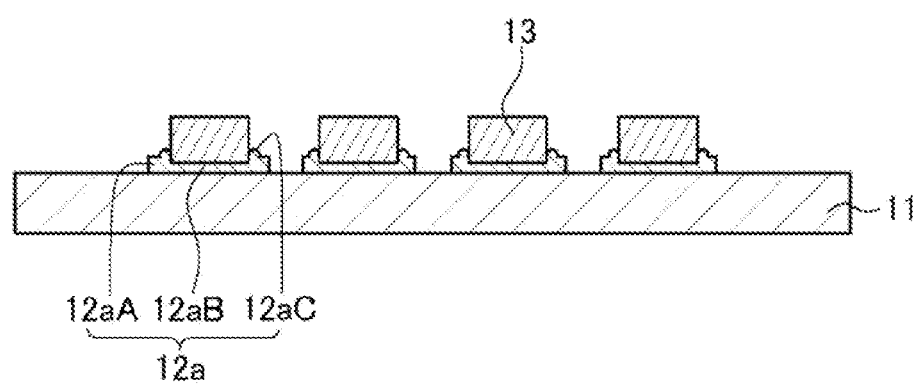
FIG. 8D is a schematic cross-sectional view explaining the method of manufacturing the light emitting device shown in FIG. 8A.

Alternatively, as shown in FIG. 8D, the light emitting elements 13 may be individually disposed on multiple portions of the reflective resin 12a disposed at multiple locations on the substrate 11 spaced apart from each other as shown in FIG. 8D. Disposing the reflective resin 12a in this manner can effectively suppress the light emitting elements 13 from moving along with the resin and coming into contact with adjacent light emitting elements 13. However, depending on the amount of the reflective resin 12a disposed at each position and/or the pushing force applied to the light emitting elements 13 some or all of adjacent reflective resins 12a may end up being connected.

Process for Forming Frame (S3)

As an option, at any given stage after disposing the light emitting elements 13 on the reflective resin 12a or applying the reflective resin 12a on the substrate 11, as shown in FIG. 3A and FIG. 4C, a frame 14 is further formed on the substrate 11 around the light emitting elements 13. The frame 14 may be formed directly on the substrate 11 or, as shown in FIG. 4C, on the reflective resin 12a.

The frame 14, as described earlier, can be formed by using a second resin. The frame 14 can be formed, for example, by injection molding, potting, resin printing, transfer molding, compression molding, or the like.

The frame 14 may be formed by hardening the second resin subsequent o hardening the reflective resin 12a. In the case in which the reflective resin 12a has been applied on the substrate, however, the second resin for forming the frame 14 is preferably hardened at the same time the reflective resin 12a is hardened in the process for hardening a reflective resin described later. This can simplify the manufacturing process.

Figure 8E:
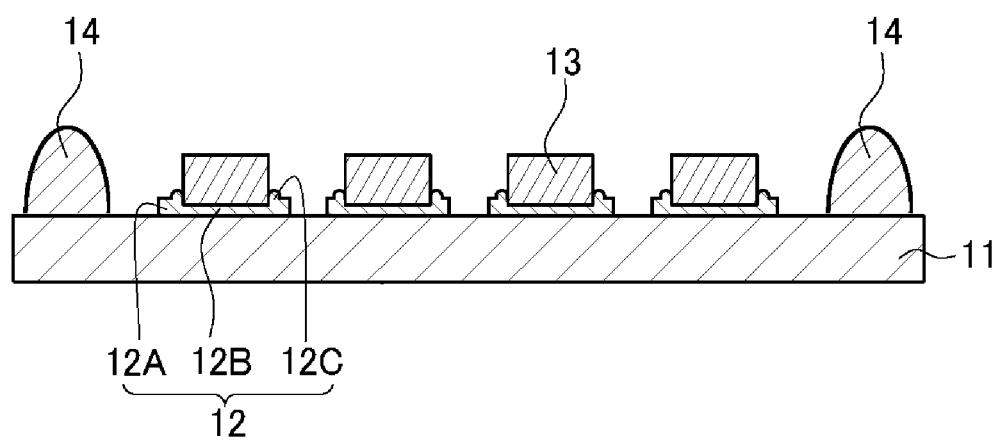
FIG. 8E is a schematic cross-sectional view explaining the method of manufacturing the light emitting device shown in FIG. 8A.

Subsequent to disposing the light emitting elements 13 on the reflective resin 12a, a frame 14 may be formed to collectively enclose the light emitting elements 13 on the substrate 11 at any given stage before or after hardening the reflective resin 12a as shown in FIG. 8E.

Process for Hardening Reflective Resin (S4)

As shown in FIG. 3A and FIG. 4D, the reflective resin 12a is hardened. In this case, when a second resin for forming a frame 14 is disposed, the second resin is preferably hardened together with the reflective resin 12a.

The reflective resin 12a can be hardened by applying heat, for example, in the temperature range of 50° C. to 200° C. for 5 to 300 minutes, more preferably in the temperature range of 80° C. to 180° C. for 10 to 120 minutes.

By the time the reflective resin 12a hardened in this manner, the solvent contained in the reflective resin 12a has completely been volatilized, not remaining or practically not remaining in the reflective resin layer 12. Practically not remaining here means that the content is no inure than 5 mass percent, no more than 3 mass percent, no more than 1 mass percent, or no more than 0.5 mass percent of the mass of the material used, i.e., the solvent in this case. The reflective resin 12a shrinks when hardened, and the portions of the reflective resin layer 12 where the light emitting elements 13 are disposed become the second flat parts 12B, which have a smaller thickness than the thickness of the first flat part 12A of the reflective resin layer 12 where the light emitting elements 13 are not disposed. The mounds of the reflective resin 12a formed as the portions of the reflective resin 12a immediately under the light emitting elements 13 are displaced outward from the light emitting elements become the first protruded parts 12C around the light emitting elements 13, each having an outwardly bulging arc shape in a cross section taken perpendicularly to a main face of the substrate. These parts of the reflective resin layer 12 can effectively reflect the light exiting the lower lateral faces of the light emitting elements upwards, thereby increasing the luminous flux and the light extraction efficiency. Furthermore, the first reflective material in the reflective resin layer 12 can efficiently dissipate the heat at the lower lateral faces of the light emitting elements, thereby reducing the thermal resistance. This makes it possible to apply a large current to the light emitting device thereby contributing to improving the light extraction efficiency.

As described earlier, in the case in which multiple portions of the reflective resin 12a is applied on the substrate at multiple locations spaced apart from one another, a plurality of first flat parts 12A can be formed all of which are spaced apart from one another as shown in FIG. 8A, or some of which remain spaced apart from one another. In other words, the reflective resin 12a corresponding to the first flat part 12A disposed between at least one pair of adjacent ones of the portions of the reflective resin 12a remains spaced apart from each other.

Process for Forming Encapsulant (S5)

As shown in FIG. 3A and FIG. 4E, an encapsulant 15 is preferably formed to cover the light emitting elements 13. When a frame 14 is formed, the encapsulant 15 is preferably formed to cover the light emitting elements 13 inward of the frame 14.

The encapsulant 15 can be formed, for example, by injection molding, potting, resin printing, transfer molding, compression molding, or the like.

In this manner, the light emitting device 10B shown in FIG. 4E can be manufactured.

The encapsulant 15 may be formed to cover the light emitting elements 13 inward of the frame 14 as shown in FIGS. 8A and 8B. In this manner, the light emitting device 10G can be manufactured.

Figure 5A:
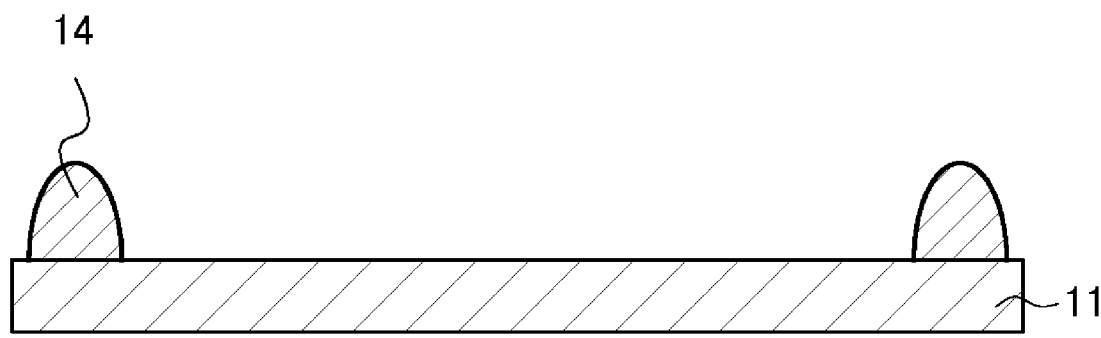
FIG. 5A is a schematic cross-sectional view explaining a method of manufacturing a light emitting device according to another embodiment of the present disclosure.

In the method of manufacturing a light emitting device described above, prior to the process S1 for applying a reflective resin on a substrate, a frame 14 may be formed on the substrate 11 (S3') as shown in FIG. 3B and FIG. 5A.

Figure 5B:
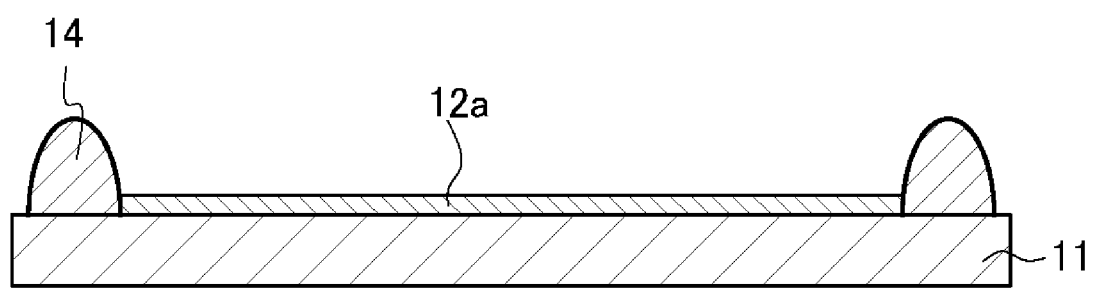
FIG. 5B is a schematic cross-sectional view explaining the method of manufacturing a light emitting device according to the embodiment of the present disclosure.

Subsequently, as shown in FIG. 3B and FIG. 5B, a reflective resin 12a is applied on the substrate as described above inward of the frame 14 (S1).

Figure 5C:
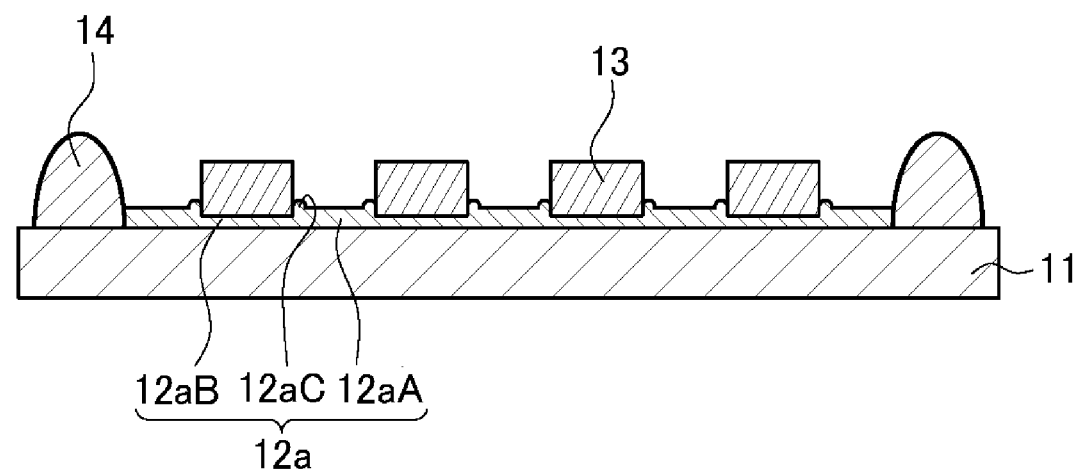
FIG. 5C is a schematic cross-sectional view explaining the method of manufacturing a light emitting device according to the embodiment of the present disclosure.
Figure 5D:
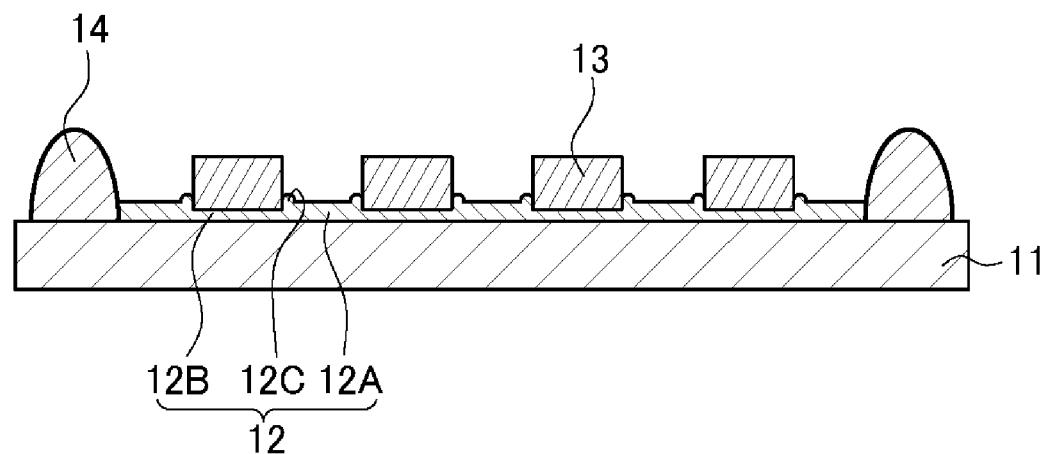
FIG. 5D is a schematic cross-sectional view explaining the method of manufacturing a light emitting device according to the embodiment of the present disclosure.

Then as shown in FIG. 3B and FIG. 5C, light emitting elements are disposed on the reflective resin 12a (S2) as described above, and a reflective resin layer 12 is formed by hardening the reflective resin 12a (S4) as described above as shown in FIG. 3B and FIG. 5D.

Figure 5E:
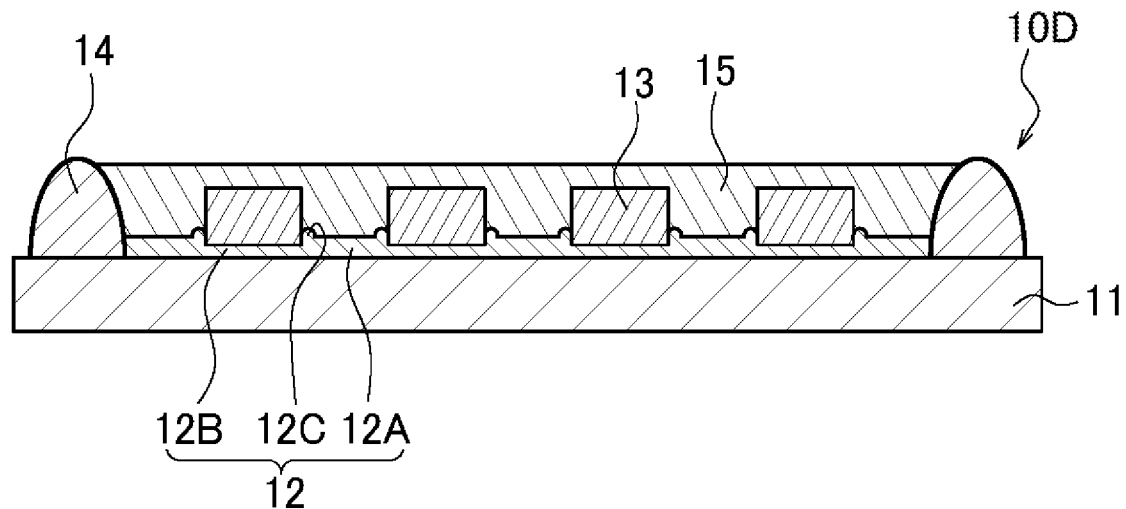
FIG. 5E is a schematic cross-sectional view explaining the method of manufacturing a light emitting device according to the embodiment of the present disclosure.
Figure 6A:
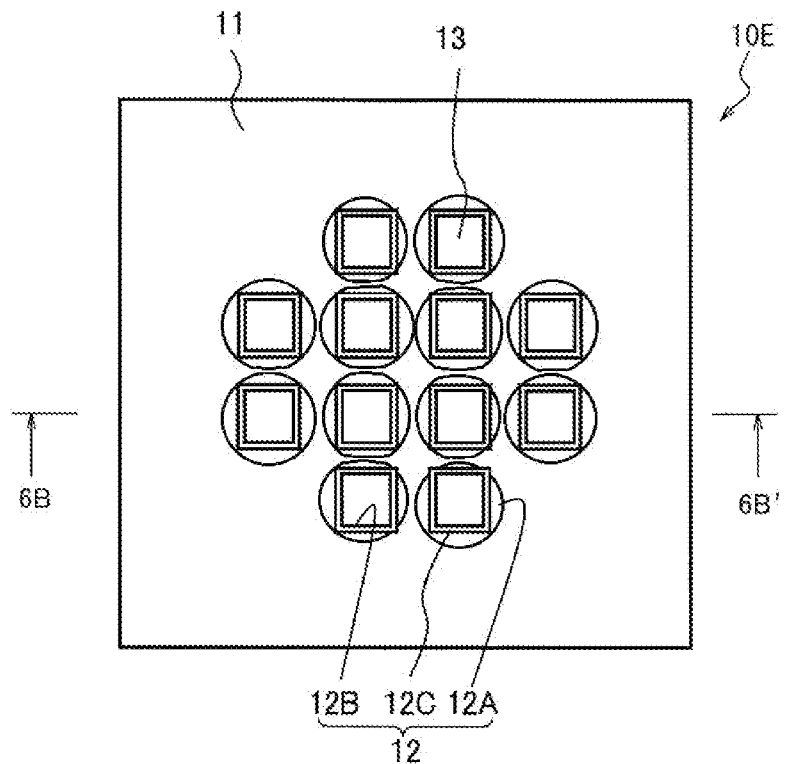
FIG. 6A is a schematic top view of a light emitting device according to another embodiment of the present disclosure.
Figure 6B:
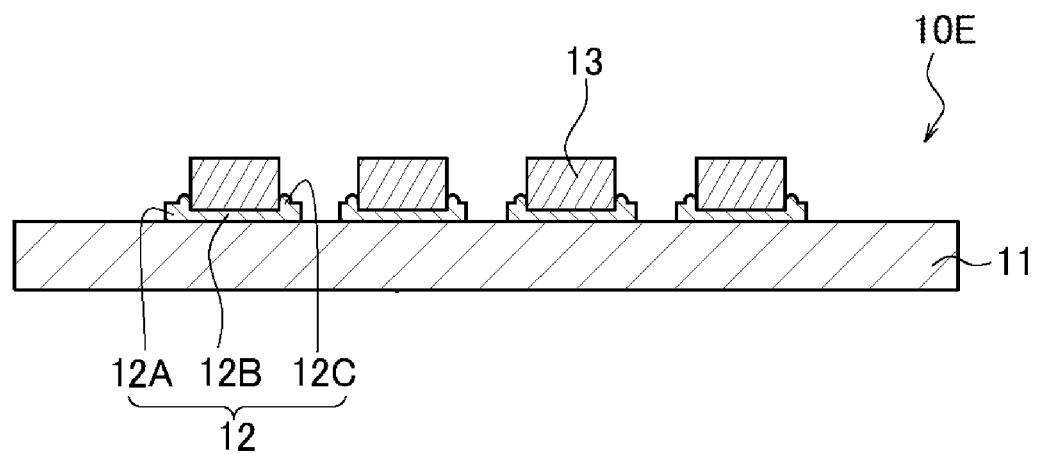
FIG. 6B is a cross-sectional view taken along 6B-6B' in FIG. 6A.

Then as shown in FIG. 3B and FIG. 5E, an encapsulant 15 is preferably formed (S5) to cover the light emitting elements 13 as described above.

In this manner, the light emitting device 10D shown in FIG. 5E can be manufactured.

Such a method of manufacturing a light emitting device can form in a simplified manner a reflective resin layer 12 having a first flat part 12A, a second flat part 12B, and a first protruded part 12C as described above. The light exiting the lower lateral faces of the light emitting elements can be effectively reflected upwards by such a distinctively shaped reflective resin layer 12. This can increase the luminous flux, thereby improving the light extraction efficiency. Furthermore, the reflective resin layer allows for efficient heat dissipation at the lower lateral faces of the light emitting elements. This can reduce the thermal resistance to allow for the application of a large current to the light emitting device. As such, a light emitting device having such a reflective resin layer that can contribute to improving the light extraction efficiency can be manufactured in a simplified manner.

Furthermore, forming a frame after applying a reflective resin on a substrate as shown in FIG. 3A can hinder the reflective resin from creeping up the frame as well as hindering the reflective resin layer from being detached. On the other hand, forming a frame before applying a reflective resin on a substrate as shown in FIG. 3B allows the reflective resin to be efficiently positioned at a predetermined location on the substrate.

EXAMPLE

By using one of the methods of manufacturing a light emitting device described above, a light emitting device 10B shown in FIG. 4E was produced.

The light emitting device 10B included a reflective resin layer 12 disposed on a substrate 11 formed of an aluminum sheet, and a plurality of light emitting elements 13 disposed thereon. The light emitting device 10B further included a frame 14 collectively enclosing the light emitting elements 13, and an encapsulant 15 covering the light emitting elements 13 inward of the frame 14.

The reflective resin layer 12 contained a silicone resin as the first resin which contained, as the first reflective material, 30 mass percent of titanium oxide particles having a median diameter of 0.2 μm. The reflective resin layer 12 had a first flat part 12A having a first thickness, second flat parts 12B having a second thickness smaller than the first thickness of the first flat part 12A, and first protruded parts 12C protruding from the first flat part 12A. The first flat part 12A and the second flat parts 12B had a light reflectance of 93% with respect to the light having a wavelength of 450 nm. The light emitting elements 13 were disposed on the second flat parts 12B, and the lateral faces of the first protruded parts 12C were partially in contact with the lateral faces of the light emitting elements 13. In other words, the light emitting elements 13 were disposed inward of the first protruded parts 12C.

In this light emitting device, the first thickness of the first flat part 12A was 17 μm. The second thickness of the second flat parts 12B was 2 μm to 5 μm. The thickness of the first protruded parts 12C from the upper end of the first flat part 12A was 10 μm, i.e., the third thickness (H1+H3) was 27 μm, the maximum width from the lateral faces of the light emitting elements was 10 μm, and the contact angle between the upper lateral face of the first protruded parts 12C and the lateral faces of the light emitting elements (angle denoted as α in FIG. 1D) was 120 degrees.

As a comparative example, a light emitting device X having the same constituents except for using a modified silicone resin in place of the reflective resin layer to dispose the light emitting elements on the substrate was produced.

The brightness of the light emitting device 10B and the light emitting device X was compared. The brightness (total luminous flux) of the light emitting device 10B was 12.8% higher than that of the light emitting device X, revealing that the light extraction efficiency of the light emitting device 10B improved as compared to the light emitting device X. Furthermore, when compared, the thermal resistance of the light emitting device 10B was 10% lower than that of the light emitting device X.

What is claimed is:

1. A light emitting device comprising:
   a substrate;
   a reflective resin layer disposed on the substrate and containing a first reflective material and a first resin, the reflective resin layer including
   a first flat part having a first thickness,
   a second flat part having a second thickness smaller than the first thickness, and
   a protruded part having a third thickness larger than the first thickness;
   a light emitting element disposed on the second flat part of the reflective resin layer, with a portion of a lateral face of the protruded part of the reflective resin layer being in contact with a portion of a lateral face of the light emitting element; and
   a frame containing a second reflective material and a second resin, wherein
   the light emitting element is disposed inward of the protruded part in a plan view, and
   the frame is disposed outward of the protruded part and encloses the light emitting element in the plan view.

2. The light emitting device according to claim 1, wherein the first flat part is located around the protruded part in contact with the protruded part, and the first thickness of the first flat part is 10 μm to 100 μm.

3. The light emitting device according to claim 1, wherein the second thickness of the second flat part is 1 μm to 20 μm.

4. The light emitting device according to claim 1, wherein an area of the second flat part is the same as an area of the light emitting element in a plan view.

5. The light emitting device according to claim 1, wherein the substrate is a metal substrate containing at least one of aluminum, copper, and iron.

6. The light emitting device according to claim 1, wherein the third thickness of the protruded part is 3 μm to 30 μm.

7. The light emitting device according to claim 1, wherein the third thickness of the protruded part is no more than 0.3 times a thickness of the light emitting element.

8. The light emitting device according to claim 1, wherein a width of the protruded part is 25 μm at most in a plan view.

9. The light emitting device according to claim 1, wherein the light emitting element is configured to emit light having a peak wavelength in a range of 350 nm to 500 nm, and
the first flat part or the second flat part has a light reflectance of at least 90% with respect to light having a wavelength of 450 nm.

10. The light emitting device according to claim 1, wherein
the protruded part surrounds the light emitting element in a plan view.

11. The light emitting device according to claim 1, wherein
the protruded part is arc shaped bulging outwardly in a cross section taken perpendicularly to a main face of the substrate.

12. The light emitting device according to claim 1, wherein
a contact angle formed by an upper lateral face of the protruded part and the portion of the lateral face of the light emitting element in contact with the protruded part is at least 90 degrees.

13. The light emitting device according to claim 1, wherein
the light emitting element is directly adhered to the reflective resin layer.

14. The light emitting device according to claim 1, wherein
the first resin is at least one selected from the group consisting of silicone resin and epoxy resin.

15. The light emitting device according to claim 1, wherein
the first reflective material is at least one selected from the group consisting of titanium oxide, boron nitride, silicon oxide, and aluminum oxide.

16. The light emitting device according to claim 1, wherein
a median diameter of particles constituting the first reflective material is no more than 1 μm.

17. The light emitting device according to claim 1, further comprising
a plurality of additional light emitting elements, wherein the reflective resin layer further includes
a plurality of additional second flat parts each having the second thickness, with the additional light emitting elements being respectively disposed on the additional second flat parts, and
a plurality of additional protruded parts each having the third thickness with a portion of a lateral face of each of the additional protruded parts being in contact with a lateral face of a corresponding one of the additional light emitting elements,
the first flat part of the reflective resin layer is arranged such that
the first flat part of the reflective resin layer continuously extends between adjacent ones of the protruded part and the additional protruded parts, or
a gap is formed in the first flat part to expose a part of the substrate between at least one pair of adjacent ones of the protruded part and the additional protruded parts.

18. A method of manufacturing a light emitting device comprising:
applying a reflective resin containing a first reflective material and a first resin on a substrate;
disposing a light emitting element on the reflective resin applied on the substrate by pressing a portion of the light emitting element into the reflective resin, thereby forming with the reflective resin,
a first flat part where the light emitting element is not disposed, the first flat part having a first thickness,
a second flat part where the light emitting element is disposed, the second flat part having a second thickness smaller than the first thickness, and
a protruded part partially in contact with a portion of a lateral face of the light emitting element, the protruded part having a third thickness larger than the first thickness; and
hardening the reflective resin, wherein
the applying of the reflective resin on the substrate includes applying a plurality of portions of the reflective resin spaced apart from one another, and
the disposing of the light emitting element includes disposing the light emitting element and a plurality of additional light emitting elements respectively on the portions of the reflective resin such that the reflective resin corresponding to the first flat part disposed between at least one pair of adjacent ones of the portions remains spaced apart from each other.

19. The method of manufacturing a light emitting device according to claim 18, wherein
the disposing of the light emitting element includes forming the protruded part to surround the light emitting element in a plan view.

20. The method of manufacturing a light emitting device according to claim 18, wherein
the disposing of the light emitting element includes forming the protruded part to have an outwardly bulging arc shape in a cross section taken perpendicularly to a main face of the substrate.

21. The method of manufacturing a light emitting device according to claim 18, wherein
the disposing of the light emitting element further includes
disposing a plurality of additional light emitting elements on the reflective resin, and
forming a plurality of additional protruded parts respectively in contact with a portion of a lateral face of a corresponding one of the additional light emitting elements, with the first flat part continuously extending between adjacent ones of the protruded part and the additional protruded parts.

* * * * *